(12) United States Patent
Tanaka et al.

(10) Patent No.: US 7,026,236 B2
(45) Date of Patent: Apr. 11, 2006

(54) METHOD OF FORMING MULTILAYER INTERCONNECTION STRUCTURE, METHOD OF MANUFACTURING CIRCUIT BOARD, AND METHOD OF MANUFACTURING DEVICE

(75) Inventors: Hideki Tanaka, Chino (JP); Ichio Yudasaka, Chino (JP); Mitsuru Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/877,999

(22) Filed: Jun. 29, 2004

(65) Prior Publication Data
US 2005/0026421 A1 Feb. 3, 2005

(30) Foreign Application Priority Data
Jul. 7, 2003 (JP) ............................. 2003-193028

(51) Int. Cl.
*H01L 21/4763* (2006.01)
(52) U.S. Cl. ....................................... 438/622; 438/672

(58) Field of Classification Search ................ 438/622, 438/624, 628, 637, 640, 652, 672
See application file for complete search history.

(56) References Cited

U.S. PATENT DOCUMENTS

| 5,493,152 A * | 2/1996 | Chang ........................ 257/758 |
| 6,614,112 B1 * | 9/2003 | Uchida ........................ 257/737 |

FOREIGN PATENT DOCUMENTS

JP          A 4-291240          10/1992

* cited by examiner

*Primary Examiner*—Phuc T. Dang
(74) *Attorney, Agent, or Firm*—Oliff & Berridge PLC (57) ABSTRACT

Method of forming a multilayer interconnection structure of the invention that is a method of forming a multilayer interconnection structure in which a first conductive layer and a second conductive layer are stacked via an insulating layer, and the first conductive layer and the second conductive layer are connected via through holes formed in the insulating layer. The method includes the steps of forming a first conductive layer on a substrate, forming the insulating layer with the through holes on the first conductive layer, filling conductive material into the through holes using a droplet discharge device to form a contact conductive material, and forming the second conductive layer such that it is connected to the contact conductive material.

9 Claims, 9 Drawing Sheets

METHOD OF FORMING MULTILAYER INTERCONNECTION STRUCTURE, METHOD OF MANUFACTURING CIRCUIT BOARD, AND METHOD OF MANUFACTURING DEVICE

PRIORITY CLAIM

Priority is claimed on Japanese Patent Application No. 2003-193028, filed Jul. 7, 2003, the content of which is incorporated herein by reference.

BACKGROUND OF THE INVENTION

1. Field of the Invention

The present invention relates to a method of forming a multilayer interconnection structure, a method of manufacturing circuit boards, and a method of manufacturing devices.

2. Description of the Related Art

Recently, in electronic devices such as semiconductor devices and the like, wiring has been multilayered in order to realize a high degree of integration. Moreover, in a semiconductor device having a multilayered interconnection structure, in the case of electrically connecting upper and lower wiring patterns arranged via an interlayer insulating layer, contact holes are formed in the interlayer insulating film such that connections can be made via the contact holes. For a method of forming such a multilayer interconnection structure, the following method is generally known.

First, a conductive material such as a metal is formed as a film on a substrate, and is etched in order to form a lower wiring layer. Next, an interlayer insulating layer is formed on the lower wiring film, and predetermined apertures (contact holes) are formed in the interlayer insulating layer using a photolithographic method. Furthermore, conductive material serving as contact plugs is applied over the whole surface of the interlayer insulating layer so as to fill up the contact holes, and patterned using a photolithographic method to form contact plugs. Then, conductive wiring material for an upper layer is formed as a film so as to be connected to the contact plugs, and by patterning this using a photolithographic method, an upper wiring layer is formed (for example, refer to Japanese Unexamined Patent Application, First Publication No. Hei 4-291240).

In the above-described Japanese Patent Publication, when contact plugs and wiring layers are formed, a photolithographic method is used. That is, a process is performed in which, after contact holes are formed, conductive material is deposited, resist is applied onto the conductive material, exposed and developed, and after the conductive material is etched with the resist used as a mask, the resist is removed. In this case, since the process is such that the conductive material is deposited firstly over the whole surface, and etched afterwards, leaving a predetermined pattern, the efficiency of material usage is extremely low. Furthermore, the number of processes is high, which can lead to an increase in the manufacturing cost.

SUMMARY OF THE INVENTION

The present invention addresses the aforementioned problems, with an object of providing a forming method for a multilayer interconnection structure that can increase the efficiency of material usage, reduce the number of processes, and thus enable the manufacturing cost to be reduced.

Furthermore, it is an object to provide a method of forming a multilayer interconnection structure that can form stable, conductive material for contacts, regardless of the shape and size (for example, internal diameter of contact holes), and can handle a range of shapes and sizes of contact holes.

Moreover, it is an object to provide a method of forming a multilayer interconnection structure that makes it difficult for connection failures to occur, and that provides high reliability, by simplifying the process sequence.

Furthermore, it is an object to provide a method of manufacturing circuit boards, and a method of manufacturing devices, in which this method for forming a multilayer interconnection structure is used.

In order to achieve the above objects, the present invention provides a method of forming a multilayer interconnection structure. The method comprises the steps of forming a first conductive layer on a substrate; forming an insulating layer with contact holes on said first conductive layer; filling said contact holes with conductive material using a droplet discharge device to form conductive contact material; and forming a second conductive layer such that it is connected to said conductive contact material, whereby said first conductive layer and said second conductive layer are stacked via said insulating layer, and are connected via contact holes formed in said insulating layer.

The present invention provides an ideal method for electrically connecting a first conductive layer and a second conductive layer, which are formed via an insulating layer. That is, in the present invention, a droplet discharge method using a droplet discharge device is used as a method for filling conductive material into contact holes, which enables the use of either a fixed position arrangement, or a fixed volume arrangement for droplets containing conductive material. As a result, the aforementioned problems are completely solved, and compared with the case where a conventional photolithographic method is used for example, it is possible to increase the efficiency of material usage, and the number of processes can be reduced. Therefore, it is possible to realize a reduction in TAT (Turn Around Timer), thus enabling the manufacturing cost to be reduced. Furthermore, regardless of the shape and size (for example, internal diameter) of the contact holes, it is possible to discharge droplets stably using a droplet discharge device, even into a contact hole with a comparatively small diameter. That is, it is possible to supply conductive material to a range of shapes and sizes of contact holes stably.

For a method of forming a multilayer interconnection structure of the present invention, the step of forming an insulating layer may comprise the steps of forming a mask on a predetermined contact hole forming region on a first conductive layer; forming an insulating layer on the first conductive layer excluding the formed mask; and removing the mask and forming a through hole serving as the contact hole in the insulating layer.

In this case, it is not necessary to use a method for dry etching the insulating layer to form the contact holes, and hence associated expensive vacuum equipment is not required. Therefore, it is possible to form the contact holes quickly, as well as to reduce the time and energy required to form contact holes, so that it is possible to reduce the cost when multilayer interconnection structure is formed. Furthermore, since dry etching is not used, problems such as plasma damage or curing of the photoresist serving as an etching mask do not occur. Moreover, the lower conductive layer is only exposed to the mask remover, and the conductive layer is not etched. Therefore, it is possible to form stable contact holes. Furthermore, the internal diameter can be made relatively small using the above method, and as a result, it is possible to provide a larger area to use effectively for wiring. Even in the case where the internal diameter of the contact holes is made small in this manner, since the present invention uses a droplet discharge device to fill the conductive material, it is possible to supply the conductive material stably.

Moreover, in a method of forming a multilayer interconnection structure of the present invention, the step of forming an insulating layer may comprise the steps of applying liquid insulating material onto the region excluding the mask on the first conductive layer; and solidifying the liquid insulating material that has been applied. Thus, it is possible to form an insulating layer without using vacuum equipment or the like, and the steps can be simplified and the cost reduced. As the liquid insulating material, SOG (Spin On Glass) having siloxane bonds, polysilazane, polyimide, low dielectric material (so-called low-K material) and the like can be used. Furthermore, the liquid insulating material need not always be nonconductive, provided that the finally obtained film is nonconductive. Furthermore, such liquid insulating material can be formed as an insulating film typically made by heat treatment, after being dissolved in an organic solvent and applied. Therefore, the insulating material solidification step preferably involves heating the applied insulating material.

The above-described method of forming a multilayer interconnection structure of the present invention can be used for example in a manufacturing process of a circuit board. A circuit board manufactured in this manner has a multilayer interconnection structure, the electrical connections between the layers are extremely good, and furthermore the manufacturing cost can be reduced. Furthermore, the above-described method of forming a multilayer interconnection structure can be used in a manufacturing process of devices for example. In this case, the devices manufactured are low cost and have extremely high reliability.

DETAILED DESCRIPTION OF THE INVENTION (Method of Manufacturing Circuit Boards)

Hereunder is a detailed description of an embodiment with reference to drawings. FIG. 1A to FIG. 3 are sectional schematic diagrams showing the general process of one method of manufacturing a circuit board in which a method of forming a multilayer interconnection structure of the present invention is used. Here, in each drawing, the scaling of each layer and each member is adjusted in order to make each layer and each element large enough to understand.

Figure 3:
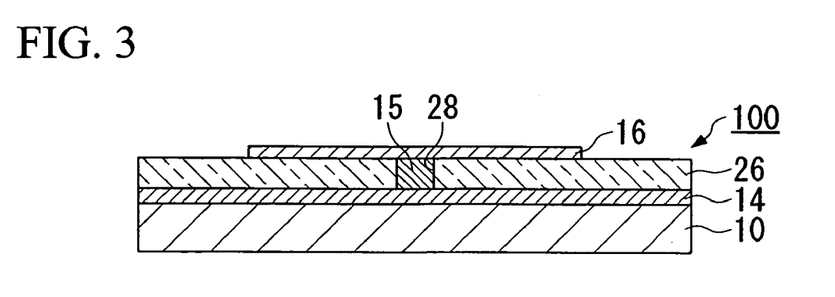
FIG. 3 is a sectional schematic diagram showing an example of a circuit board obtained by the manufacturing method of the present embodiment.

First is a description of the structure of a circuit board 100 to be manufactured, using FIG. 3. The circuit board 100 as shown in FIG. 3 has a first conductive film (polysilicon film) 14 on the surface of a glass substrate (base material) 10, and a second conductive film 16 is formed on the upper layer of the first conductive film 14 via an interlayer conductive film (conductive layer) 26. The first conductive film 14 and second conductive film 16 are electrically connected via a contact plug 15, that is, the circuit board 100 has a multilayer interconnection structure.

Figure 1A:
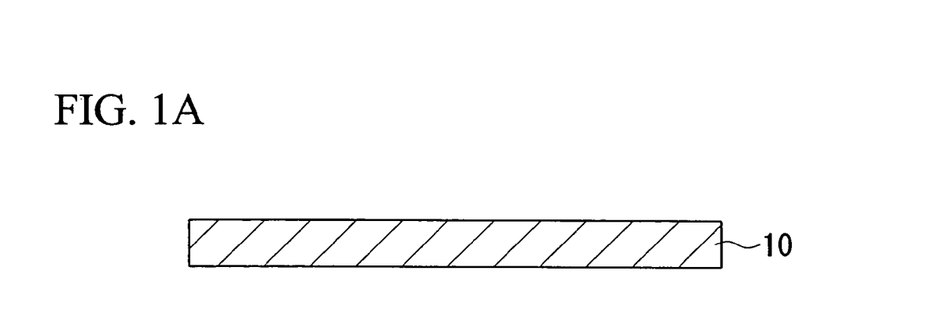
FIGS. 1A to 1C are sectional schematic diagrams showing a process in a method of manufacturing a circuit board of the present embodiment.
Figure 1B:
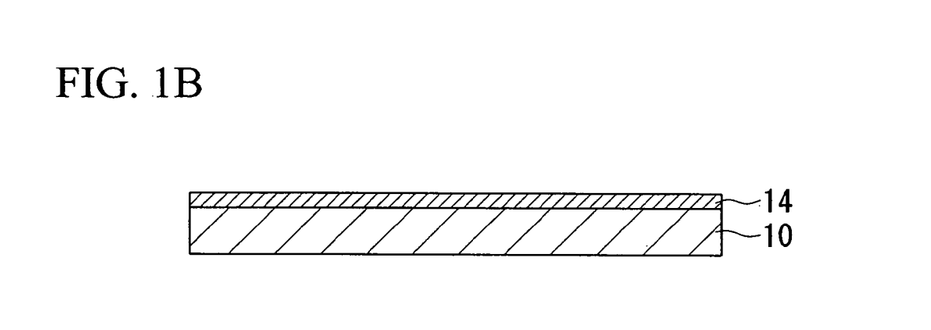

Hereunder is a description of a method of manufacturing a circuit board 100 with this multilayer interconnection structure with reference to FIG. 1A to FIG. 3. Firstly, a glass substrate 100 as shown in FIG. 1A is prepared. Then, as shown in FIG. 1B, a polysilicon film 14 is formed on the glass substrate 10. This polysilicon film 14 can be formed in the following way, for example. Firstly, liquid silane is applied to the glass substrate 10 and dried. Then, the dried silane film is baked and thermally decomposed to form an amorphous silicon film. Furthermore, an excimer laser such as a XeCl is radiated onto the amorphous silicon film to anneal it, and the amorphous silicon film is multicrystalized to make the polysilicon film 14.

Figure 1C:
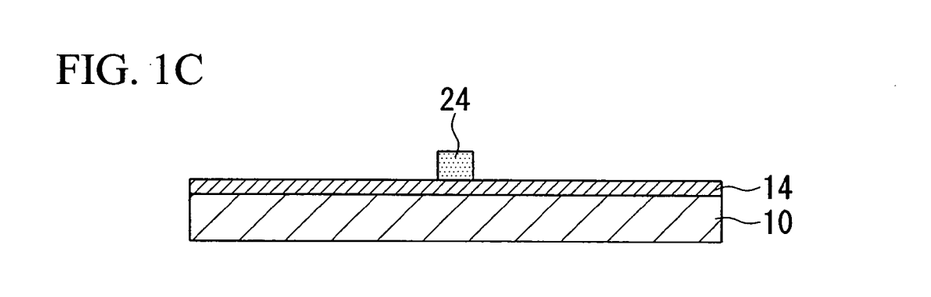

Next, as shown in FIG. 1C, a mask 24 is formed in a predetermined region of the polysilicon film 14. To be specific, the mask 24 is formed in a predetermined region where a contact hole 28 (refer to FIG. 3) will be formed later. Here, as a method of selectively forming the mask 24, photosensitive resist material is first applied over the whole surface of the polysilicon film 14 (for example by spin coating, dip coating or the like). Then, the above-described predetermined region only is exposed selectively by mask exposure, and then developed to form the predetermined pattern of the mask 24. Spin coating, dip coating or the like can be used as a method of applying the resist material. Furthermore, after the exposure and development steps, the mask to be formed is cured by vacuum UV irradiation.

Figure 2A:
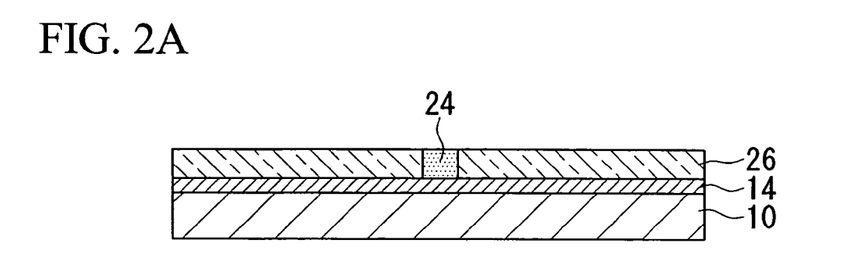
FIGS. 2A to 2C are sectional schematic diagrams showing the process in the method of manufacturing a circuit board following FIGS. 1A to 1C.

Next, as shown in FIG. 2A, an insulating layer 26 formed from liquid insulating material is formed around the formed mask 24, that is, over the whole surface of the polysilicon film 14 excluding the mask 24. This insulating layer 26 may be formed by applying liquid insulating material over the whole surface of the polysilicon film 14 excluding the mask 24, and then baking it to thermally decompose it. By so doing, there is no need to use expensive vacuum equipment, and hence the input energy and time required for film formation can be reduced.

The above-described liquid insulating material is applied by so-called spin coating in the case of the present embodiment. However, the liquid insulating material may also be applied by dip coating, liquid source misted chemical deposition (LSMCD), slit coating, or the like. Furthermore, the liquid insulating material can also be applied by a droplet discharge device such as a so-called inkjet device. If such a liquid discharge device is used, it is possible to apply it quantitatively onto only a desired part, and hence the material used can be reduced. Moreover, as the liquid insulating material, SOG (Spin On Glass) having siloxane bonds, polysilazane, polyimide, low dielectric material (so-called low-K material) and the like may be used. Furthermore, the liquid insulating material need not always be nonconductive, provided that the film obtained at the end is nonconductive. Moreover, such liquid insulating material can be formed as an insulating film 26, typically made by heat treatment after being dissolved in an organic solvent and applied. Therefore, the liquid insulating material solidification step preferably involves heating the applied liquid insulating material.

Figure 2B:
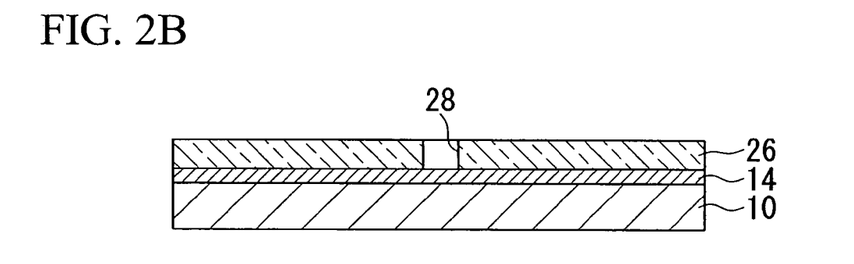

Next, a mask 24 removing step is performed, and as shown in FIG. 2B, a through hole (contact hole) 28 is formed in the region of the insulating layer 26 in which the mask 24 was formed. The mask 24 removing step can be performed, by ashing with oxygen plasma under atmospheric pressure or reduced pressure, ashing with ozone, or with normal photoresist peeling liquid. When removing the mask 24 using these methods, a method may be selected that does not affect the lower polysilicon film 14 (influence of over etching, or the like), thus enabling a contact hole to be opened stably.

Figure 2C:
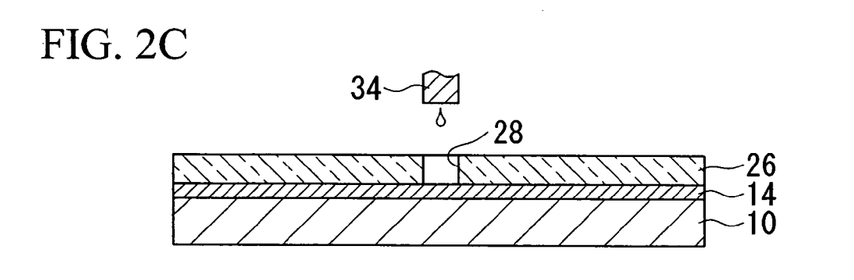

Next, as shown in FIG. 2C, liquid contact forming material with an organic compound as its main constituent is supplied to the through hole (contact hole) 28 using a droplet discharge device having a droplet discharge head 34. Afterwards, the liquid contact forming material inside the through hole (contact hole) 28 is baked and solidified to form a contact plug 15 as shown in FIG. 3. Then after the contact plug 15 is formed, a liquid wiring material wherein for example fine powder, being conductive material, is dispersed in an organic solvent, is similarly supplied in a predetermined pattern by using the droplet discharge device, and this is then heat treated to form a second conductive film 16 as shown in FIG. 3. As a result, the polysilicon film 14 and the second conductive film 16 are electrically connected via the contact plug 15 provided in the contact hole 28.

In addition, in the above-described manufacturing process of the present embodiment, the mask 24 is formed in advance in order to form a contact hole in the insulating layer 26, and the through hole remaining after removing the mask 24 is used as the contact hole. However, it is also possible to form a through hole in the insulating layer 26 by using an alternative photolithographic method. Furthermore, in the above embodiment, photoresist is used as the mask 24, and this is patterned by exposure and development. However, it is also possible to use a droplet discharge method using a droplet discharge device in order to selectively supply mask forming material (regardless of whether inorganic material or organic material) to a predetermined contact hole forming region. In the case where the mask forming material is selectively supplied to the predetermined contact hole forming region in this manner, it is desirable to perform a surface treatment step to make the contact forming region lyophilic and the surroundings liquid-repelling, and then perform the selective application step. As a result, it is possible to increase the wettability and the adhesiveness of the organic material to the contact hole forming region and to prevent the organic material from spreading out to the surroundings, so that the mask can be aligned reliably in the contact hole forming region.

Moreover, in the manufacturing process of the present embodiment, it is possible to form the mask 24 using an inorganic material. In this case, the inorganic material is deposited on the substrate to form a deposited film, and the deposited film can be formed in the contact hole forming region selectively by etching. Here, vacuum deposition, physical deposition such as sputtering, or chemical deposition such as CVD, can be used to deposit the inorganic mask material onto the substrate.

Furthermore, in the manufacturing process of the present embodiment, a step of removing the mask 24 can be performed by, in the case where the mask 24 is formed from organic material, ashing with oxygen plasma under atmospheric pressure or reduced pressure, ashing with ozone, or with normal photoresist peeling liquid. Moreover, in the case where the mask 24 is formed from inorganic material, the mask 24 can be removed by soaking in an etchant capable of dissolving this inorganic material, and can also be removed by spin etching. When removing the mask 24 using these methods, a method may be selected that does not affect the lower polysilicon film 14 (influence due to over etching, or the like), thus enabling a contact hole to be opened stably.

Figure 9:
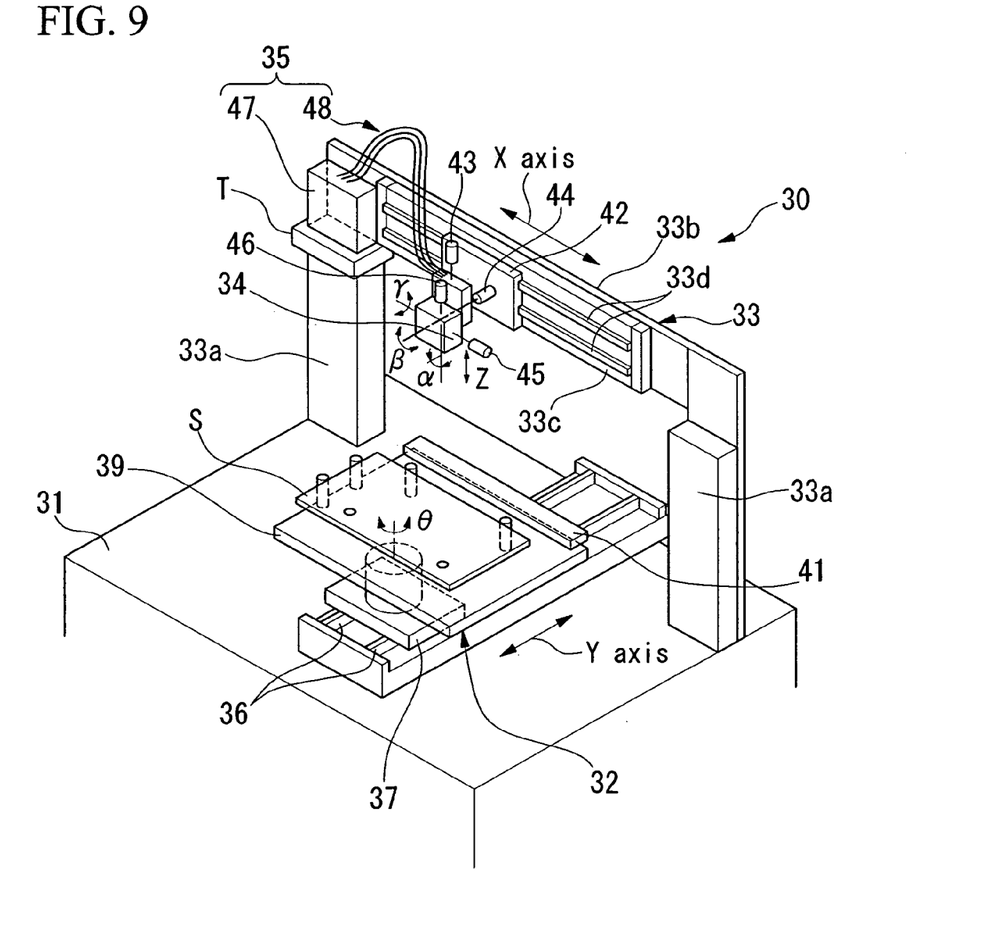
FIG. 9 is a perspective view showing the structure of a droplet discharge device used in the present embodiment.

Here is a description of a general structure of a droplet discharge device used in the present embodiment. FIG. 9 is a perspective view showing the general structure of an inkjet device 30 of an embodiment of the droplet discharge device. This inkjet device 30 comprises a base 31, a substrate moving device 32, a head moving device 33, an inkjet head (head) 34, an ink supply device 35, and so on.

The base 31 is constructed with the substrate moving device 32 and the head moving device 33 provided thereon. The substrate moving device 32 is provided on the base 31, and has guide rails 36 arranged along the Y axis direction. This substrate moving device 32 is constructed such that a slider 37 is moved along the guide rails 36 by a linear motor or the like. The slider 37 has a motor (not shown in the figure) for the θ axis. This motor is a direct drive motor, for example, and its rotor (not shown in the figure) is fixed to a table 39. Using such a construction, when electricity is applied to the motor, the rotor and the table 39 rotate in the θ direction so as to index (rotary index) the table 39.

The table 39 locates and holds a substrate S (in the state of FIG. 2C), being an object onto which droplets are applied. The substrate S is located and held accurately at a predetermined location on the table 39 by a locating pin (not shown in the figure) on the table 39. The table 39 has a test area 41, which the inkjet head 34 uses for waste droplets or test droplets of ink (liquid contact forming material or the like in the case of the present embodiment).

The head moving device 33 comprises a pair of supports 33a, which are fitted at the rear of the base 31, and a track 33b fitted onto the supports 33a. The track 33b is arranged in the X axis direction, that is, at right angles to the Y axis direction. The track 33b comprises a retainer plate 33c extending between the supports 33a, and a pair of guide rails 33d arranged on this retainer plate 33c, holding a slider 42, which retains the inkjet head 34 such that it can move in the lengthwise direction of the guide rails 33d. The slider 42 travels along the guide rails 33d by the operation of a linear motor (not shown in the figure) or the like, whereby it moves the inkjet head 34 in the X axis direction.

Motors 43, 44, 45 and 46 are connected to the inkjet head 34 as rotary positioning devices. When the motor 43 is operated, the inkjet head 34 moves up and down the Z axis, enabling it to be positioned on the Z axis. Furthermore, when the motor 44 is operated, the inkjet head 34 rotates in the β direction in FIG. 9, enabling it to be positioned, when the motor 45 is operated, the inkjet head 34 rotates in the γ direction, enabling it to be positioned, and when the motor 46 is operated, the inkjet head 34 rotates in the α direction, enabling it to be positioned.

In this manner, the inkjet head 34 moves linearly in the Z axis direction on the slider 42, enabling it to be positioned, and rotates about the α, β and γ axes, enabling it to be positioned. Accordingly, it is possible to accurately control the position and attitude of the ink discharge surface of the inkjet head 34 relative to the substrate S on the table 39.

Figure 10A:
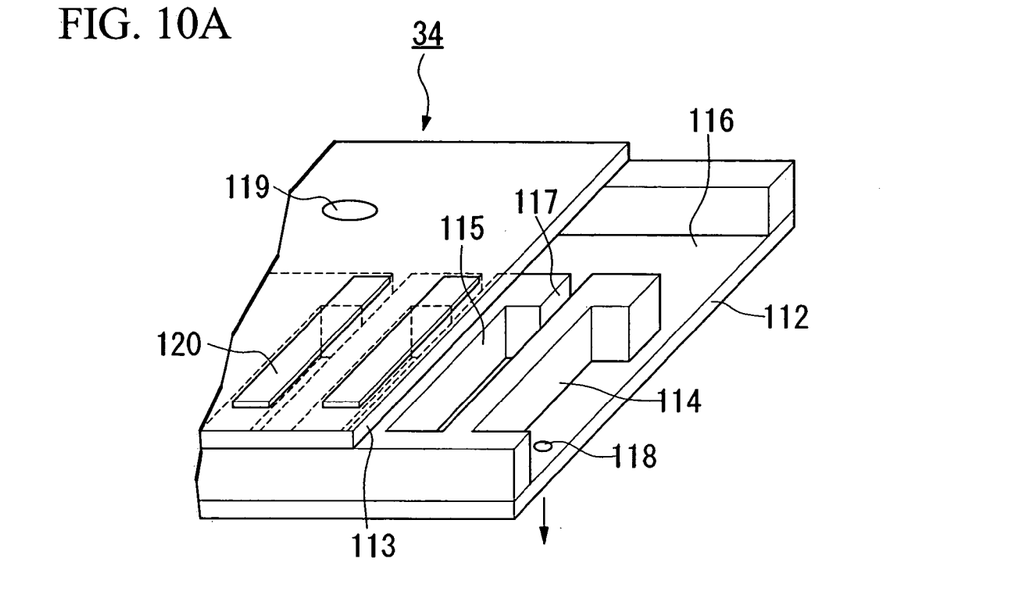
FIGS. 10A to 10B are perspective views of the main parts, and a sectional view of the main parts of FIG. 9.

Here, as shown in FIG. 10A, the inkjet head 34 has for example a nozzle plate 112 made of stainless steel, and a diaphragm 113, joined via partitions (reservoir plates) 112. A plurality of cavities 115 and a reservoir 116 are formed by the partitions 114 between the nozzle plate 112 and the diaphragm 113. The inside of the cavities 115 and the reservoir 116 are filled with ink (in the case of the present embodiment, liquid contact forming material or the like). The cavities 115 and the reservoir 116 are connected via supply ports 117. Furthermore, a plurality of nozzle holes 118 for ejecting ink from the cavities 115 is formed in a row along the nozzle plate 112. On the other hand, a hole 119 is formed in the diaphragm 113 to supply ink to the reservoir 116.

Figure 10B:
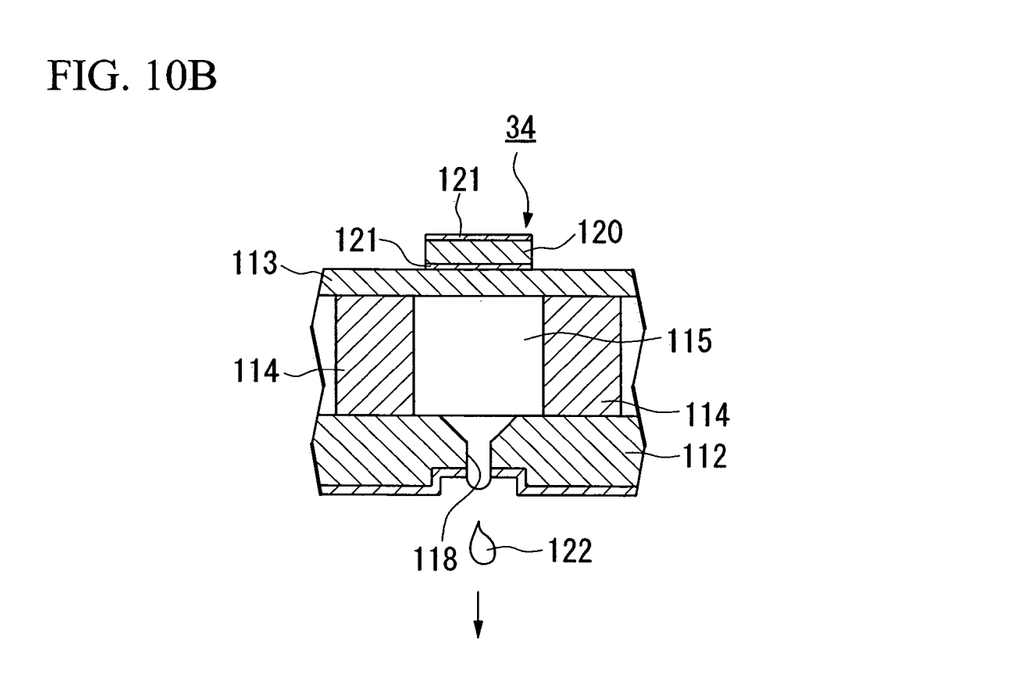

Furthermore, as shown in FIG. 10B, piezoelectric elements (piezo elements) 120 are fitted on the surface opposite the surface facing toward the cavities 115 of the diaphragm 113. The construction is such that the piezoelectric elements 120 are sandwiched between pairs of electrodes 121, and flex outward when electricity is applied. The diaphragm 113 on which the piezoelectric elements 120 are fitted in such a construction flexes outward together with the piezoelectric elements 20, thus increasing the capacity of the cavities 115. Accordingly, an amount of ink corresponding to the increase in volume in the cavities 115 flows from the reservoir 116 to the cavities 115 via the supply ports 117. Moreover, when the electricity flowing to the piezoelectric elements 120 is stopped, the piezoelectric elements 120 and the diaphragm 113 return to their original shapes. Therefore the cavities 115 also return to their original capacities. Thus the pressure of ink inside the cavities 115 increases, and liquid droplets 122 are discharged from the nozzles 118 toward the substrate.

As above, in the present embodiment, as a method of filling liquid wiring material (conductive material) into the contact holes 28, a droplet discharge method using the droplet discharge device (inkjet device) 30 as shown in FIG. 9 is used. Accordingly, compared with a conventional case where liquid wiring material is selectively arranged in the contact holes using a photolithographic method, it is possible to increase the efficiency of material usage, and the number of steps can be reduced, thus enabling the manufacturing cost to be reduced.

In the present embodiment, material whose resistivity is lower than the polysilicon film 14 and/or the second conductive film 16 is used as wiring material (conductive material) for filling the contact holes 28. By so doing, it is possible to ensure even higher conductivity in the contact plug 15.

Furthermore, in the present embodiment, after baking the wiring material (conductive material) filling the contact holes 28, conductive material for the second conductive film 16 is applied, and this is baked further. However, it is also possible to use a method in which the wiring material (conductive material) filling the contact holes 28 and the conductive material for the second conductive film 16 are applied, and afterwards baked together.

(Method of Manufacturing Devices)

Figure 4:
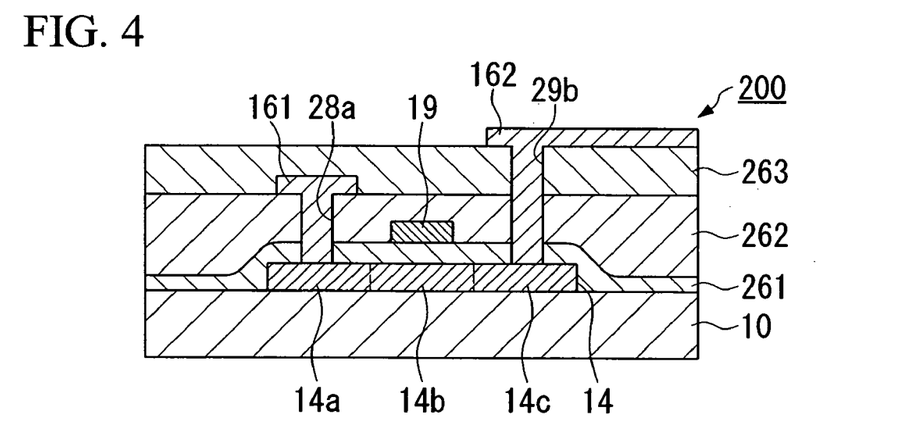
FIG. 4 is a sectional schematic diagram showing an example of a device obtained by the manufacturing method of the present embodiment.

Hereunder is a detailed description of a second embodiment of the present invention with reference to drawings. FIG. 4 is a sectional schematic diagram showing the structure of a TFT (thin film transistor) 200 as an embodiment of a device manufactured by the manufacturing method of the present embodiment. FIG. 5A to FIG. 8C are sectional views showing the general process of a method of manufacturing a TFT 200. Here, in each drawing, the scaling of each layer and each element is adjusted in order to make each layer and each element large enough to understand.

First is a description of the structure of the TFT 200 to be manufactured. The TFT 200 as shown in FIG. 4 has a polysilicon film 14 on the surface of a glass substrate (base material) 10, and the polysilicon film 14 has a source region 14a, a channel region 14b and a drain region 14c. A source electrode 161 is connected to the source region 14a via contact holes 28a and 28b, and a pixel electrode 162 is connected to the drain region 14c via contact holes 29a, 29b and 29c. That is, the TFT 200 is ideal as a pixel switching element of an electro-optic device such as a liquid crystal device or the like. Furthermore, a gate electrode 19 is formed on the upper layer of the channel region 14b of the polysilicon film 14 via a gate insulating film 261.

Here, the polysilicon film 14, being a first conductive layer, and the source electrode 161, being a second conductive layer, are stacked via the gate insulating film 261 and an interlayer insulating film 262. Furthermore, the polysilicon film 14, being a first conductive layer, and the pixel electrode 162, being a third conductive layer, are stacked via the gate insulating film 261 and two interlayer insulating films 262 and 263. As above, the TFT 200 of the present embodiment has a multilayer interconnection structure, and can be manufactured using the above-described manufacturing method of a circuit board as follows.

Hereunder is a description of a method of manufacturing a TFT 200 as shown in FIG. 4, with reference to FIG. 5A to FIG. 8C.

Figure 5A:
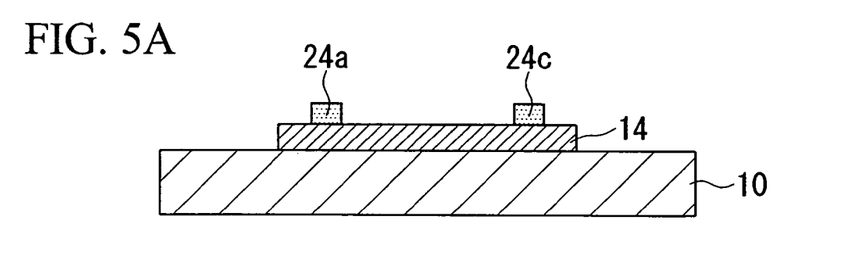
FIGS. 5A to 5D are sectional schematic diagrams showing a process of a manufacturing method of devices of the present embodiment.

As shown in FIG. 5A, a polysilicon film 14 is formed on the surface of a glass substrate 10. This polysilicon film 14 can be formed in the following way. Firstly, a liquid-repelling film such as a fluoroplastic for example (not shown in the figure) is formed on the glass substrate 10. Then, ultraviolet rays are radiated onto an element forming region of this liquid-repelling film, and the liquid-repelling film of the element forming region is decomposed and removed for patterning, in order to make liquid-repelling banks. Then, liquid silane is applied to the element forming region and dried. Next, the dried liquid silane film is baked and thermally decomposed in order to make amorphous silicon film. Furthermore, ultraviolet rays are radiated onto the whole glass substrate 10 in order to decompose and remove the liquid-repelling banks. Then an excimer laser such as a XeCl laser is radiated onto the amorphous silicon film to anneal it, and the amorphous silicon film is multicrystalized in order to make the polysilicon film 14.

Afterwards, channel doping of the polysilicon film 14 is performed. That is, appropriate impurities (for example $PH_3$ ions in the case of forming an n-type conductive layer) are discharged and dispersed over the whole surface. This polysilicon film 14 becomes a first conductive layer.

Next, photomask, being liquid organic material, is applied to the whole surface of the glass substrate 10 such that it covers the polysilicon film 14. Then, the applied photomask is dried (prebake) at a temperature of 70 to 90° C. The liquid organic material may be photosensitive resin (for example, polyimide). Moreover, the liquid organic material can be applied by spin coating, dip coating, LSMCD, slit coating, or by a droplet discharge device. Then, the photomask is exposed and developed by a photolithographic method to form masks 24a and 24c as shown in FIG. 5A on the source region 14a and the drain region 14c in the contact hole forming region. These masks 24a and 24c are formed to a height equivalent to or greater than the thickness of the gate insulating film 261 (refer to FIG. 4) to be formed later.

Figure 5B:
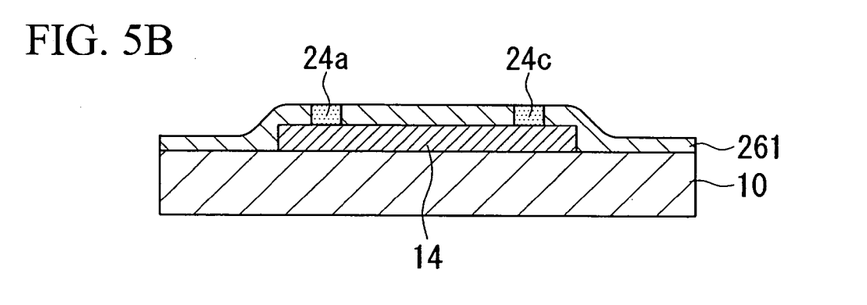

Afterwards, as shown in FIG. 5B, a gate insulating film 261 is formed over the whole surface of the glass substrate 10 (including the polysilicon film 14) excluding the masks 24a and 24c. This gate insulating film 261 can be formed using the same method as for the insulating layer 26 shown in the embodiment of a method of manufacturing a circuit board as mentioned above, that is, by applying and solidifying liquid insulating material.

Figure 5C:
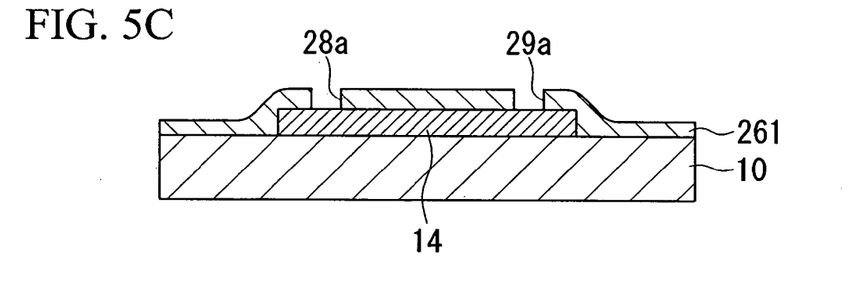
Figure 5D:
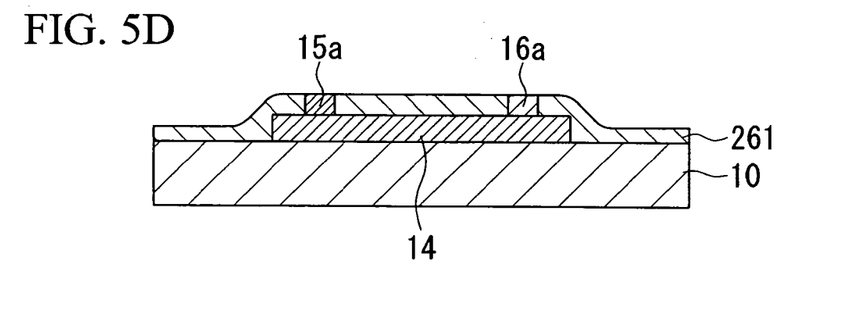

Next, the masks 24a and 24c are removed by ashing, and as shown in FIG. 5C, through holes 28a and 29a are formed in the regions of the gate insulating film 261, where the masks 24a and 24b are formed. Furthermore, liquid contact forming material with an organic metal compound as its main constituent is selectively supplied to the formed through holes 28a and 29a using an inkjet device 30 (refer to FIG. 9) as shown in FIG. 5D. Then, the liquid contact forming material inside the through holes 28a and 29a is baked and solidified to make contact plugs 15a and 16a.

Figure 6A:
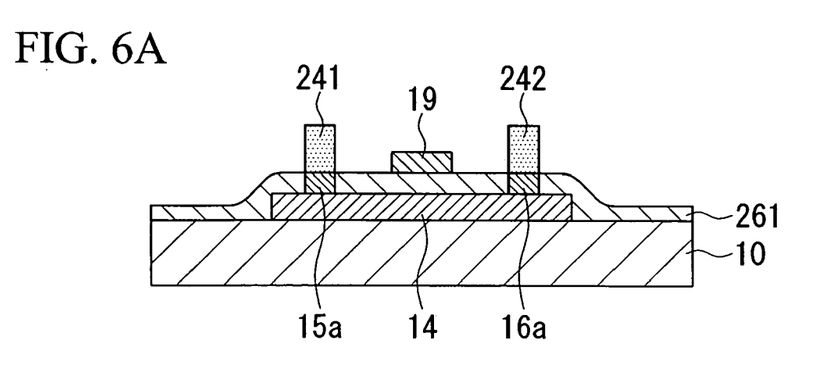
FIGS. 6A to 6C are sectional schematic diagrams showing the process of the manufacturing method of devices following FIGS. 5A to 5D.

Then, as shown in FIG. 6A, a gate electrode 19 is formed in a position corresponding to the channel region 14b on the gate insulating film 261. To be specific, liquid conductive material with an organic metal compound as its main constituent is applied over the whole surface, and patterning is performed by a photolithographic method or the like in order to form it selectively in a position corresponding to the channel region 14b. Here, appropriate impurities (for example, $B_2H_6$ in the case of forming a p-type conductive layer) are discharged into the source region 14a and the drain region 14c using the formed gate electrode 19 as a mask.

Furthermore, similarly, as shown in FIG. 6A, additional resist is formed on the two contact plugs 15a and 16a, forming masks 241 and 242 whose thickness is greater (height is greater) than an interlayer insulating film 262 to be formed later. For a method of forming these masks 241 and 242, an inkjet device 30 (refer to FIG. 9) can be used as described above, for example.

Figure 6B:
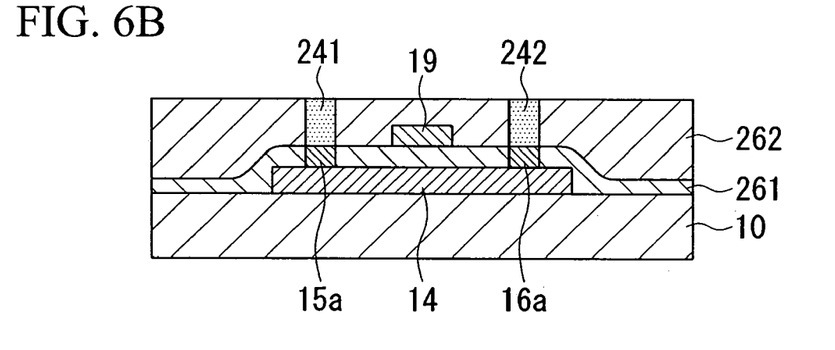
Figure 6C:
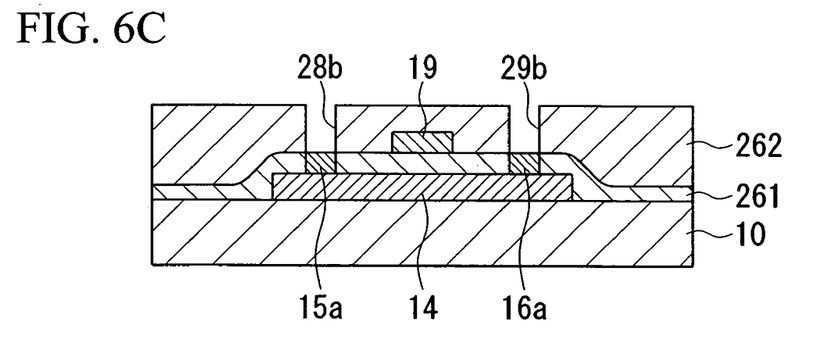
Figure 7A:
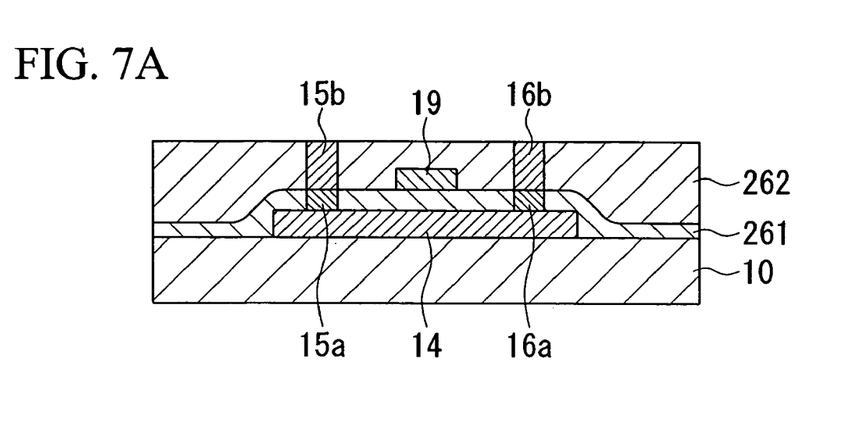
FIGS. 7A to 7C are sectional schematic diagrams showing the process of the manufacturing method of devices following FIGS. 6A to 6C.

Next, as shown in FIG. 6B, an interlayer insulating film 262 is formed over the whole surface of the glass substrate 10 (including the gate insulating film 261) excluding the masks 241 and 242. This interlayer insulating film 262 can be formed using the same method as the gate insulating film 261 as described above, that is, by applying and solidifying liquid insulating material. Furthermore, the masks 241 and 242 are removed by ashing, and as shown in FIG. 6C, through holes 28b and 29b are formed in the regions of the interlayer insulating film 262, where the masks 241 and 242 are formed. Moreover, liquid contact forming material with an organic metal compound as its main constituent is selectively supplied to the formed through holes 28b and 29b using an inkjet device 30 (refer to FIG. 9), and then contact plugs 15b and 16b are formed by baking and solidifying the liquid contact forming material as shown in FIG. 7A.

Figure 7B:
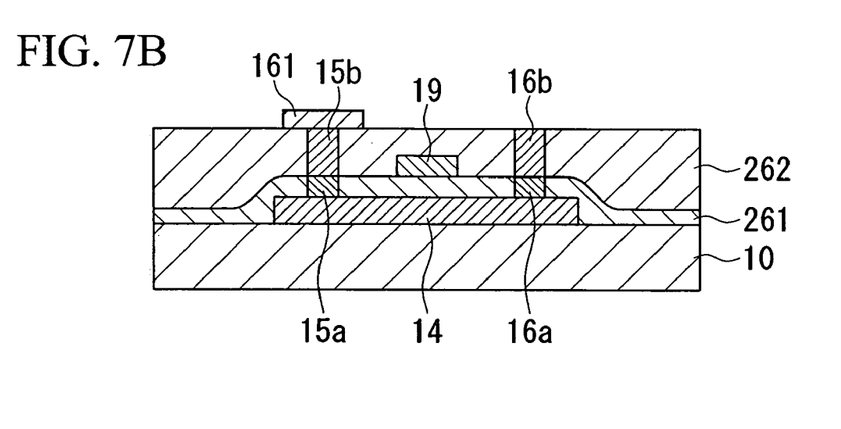
Figure 7C:
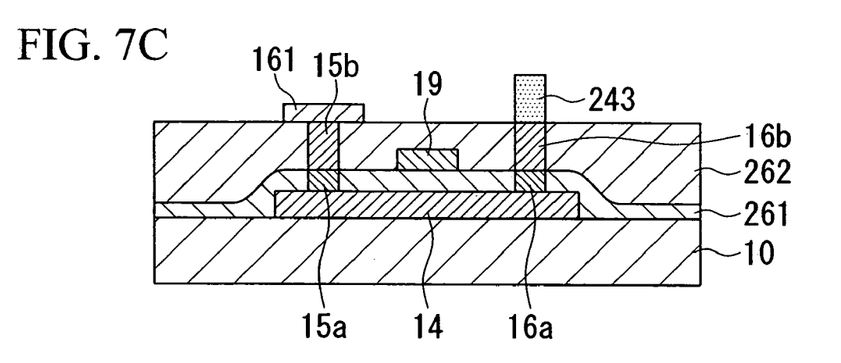

Next, as shown in FIG. 7B, a source electrode 161 is formed in a predetermined wiring pattern such that it makes contact with the contact plug 15a. When the wiring pattern of the source electrode 161 is formed, it is also possible to use an inkjet device 30 (refer for FIG. 9). After forming the source electrode 161, a mask 243 is formed on the contact plug 16b as shown in FIG. 7C. The mask in this case can be formed by a photolithographic method, a droplet discharge method using an inkjet device 30 (refer to FIG. 9), or the like.

Figure 8A:
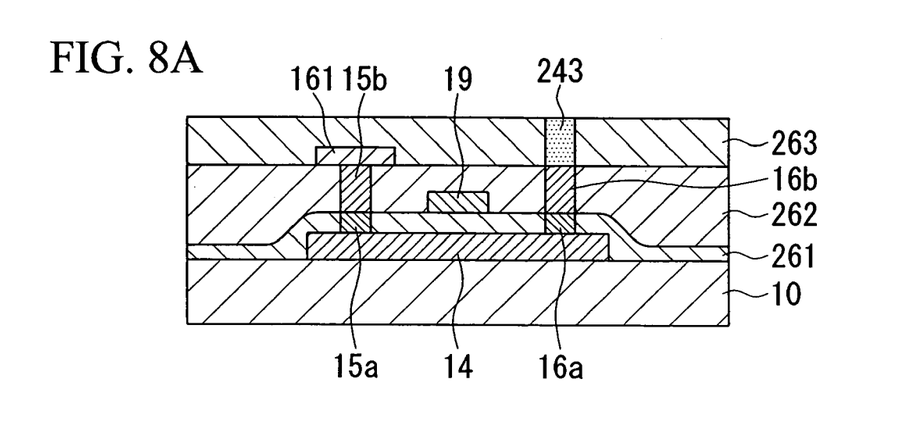
FIGS. 8A to 8C are sectional schematic diagrams showing the process of the manufacturing method of devices following FIGS. 7A to 7C.
Figure 8B:
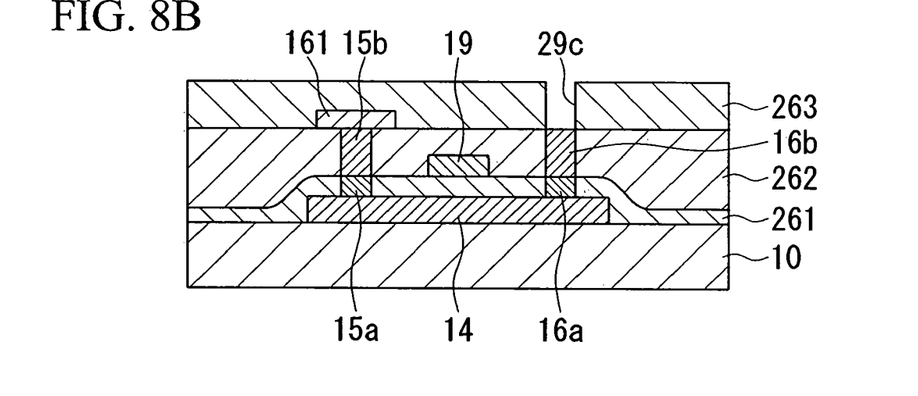

Then, as shown in FIG. 8A, an interlayer insulating film 263 is formed over the whole surface of the interlayer insulating film 262 (including the source electrode 161) excluding the mask 243. This interlayer insulating film 263 can be formed using the same method as the interlayer insulating film 262, that is, by baking and solidifying liquid insulating material. Furthermore, the mask 243 is removed by ashing, and as shown in FIG. 8B, through hole 29c is formed in the region of the interlayer insulating film 263, where the mask 243 is formed. Moreover, liquid contact forming material with an organic metal compound as its main constituent is selectively supplied to the formed through hole 29c using an inkjet device 30 (refer to FIG. 9), and then a contact plug 16c is formed by baking and solidifying the liquid contact forming material as shown in FIG. 8C.

Figure 8C:
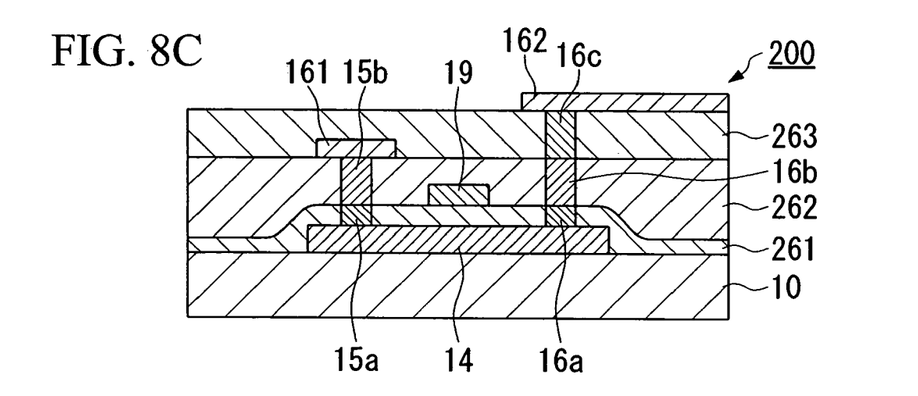

Furthermore, similarly, as shown in FIG. 8C, a pixel electrode 162 made from ITO or the like is formed in a predetermined wiring pattern such that it makes contact with the contact plug 16c. When forming a pattern of this pixel electrode 162, it is also possible to use an inkjet device 30 (refer to FIG. 9) as described above.

Using the above method, the source region 14a, being the first conductive layer and the source electrode 161, being the second conductive layer, and the drain region 14c, being the first conductive layer and the pixel electrode 162, being the second conductive layer, can be electrically connected respectively via the contact plugs 15a and 15b, and the contact plugs 16a, 16b and 16c, provided in the contact holes. In this manner, in the present embodiment, contact holes are formed by providing masks in contact hole forming regions, then forming an insulating layer around the masks, and removing the masks. Therefore, it is not necessary to etch the insulating layer in order to form the through holes (contact holes). Thus expensive vacuum equipment is not required, the number of steps can be reduced, and the steps can be simplified. Furthermore, in the present embodiment, a droplet discharge method using a droplet discharge device (inkjet device) 30 as shown in FIG. 9 is used as the method for filling liquid contact forming material into the contact holes. Accordingly, compared with the conventional case where liquid contact forming material is positioned selectively in the contact holes using a photolithographic method, it is possible to increase the efficiency of material usage, and reduce the number of steps, thus enabling the manufacturing cost to be reduced.

An embodiment of the present invention has been described above. However, the present invention is not limited to the above embodiment, and various modifications can be applied within a scope which does not depart from the scope of the claims. For example, in the methods of manufacturing devices, a selective etching method can also be used as; the film forming method, selective coating method, and method of forming through holes in the insulating layer, which are shown for the above-described manufacturing method of circuit boards.

While preferred embodiments of the invention has been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. The method of forming a multilayer interconnection structure comprising:
   forming a first conductive layer over a substrate;
   forming a mask on the first conductive layer;
   forming an insulating layer on the first conductive layer outside of the mask;
   forming a contact hole in the insulating layer by removing the mask;
   filling the contact hole with a conductive material using a droplet discharge device to form a conductive contact member; and
   forming a second conductive layer electrically connected to the first conductive layer via the conductive contact member.

2. The method of forming a multilayer interconnection structure according to claim 1, the forming an insulating layer comprises:
   applying a liquid insulating material onto the first conductive layer excluding the mask; and
   solidifying the liquid insulating material.

3. The method of forming a multilayer interconnection structure according to claim 1, the forming an insulating layer comprising forming a plurality of insulating layers, and forming a plurality of contact holes passing through each of the plurality of insulating layers, the filling the contact hole comprising filling the plurality of contact holes passing through each of the plurality of insulating layers with the conductive material.

4. The method of forming a multilayer interconnection structure according to claim 1, the conductive material having a lower resistivity than at least on of the first conductive layer and the second conductive layer.

5. The method of forming a multilayer interconnection structure according to claim 1, further comprising:
   baking the conductive material after filling the contact hole, and after forming the second conductive layer by applying a conductive material for the second conductive layer.

6. The method of forming a multilayer interconnection structure according to claim 1, further comprising:
   baking the conductive material after filling the conductive material into the contact holes; and
   baking a conductive material for the second conductive layer after applying the conductive material for the second conductive layer.

7. The method of forming a multilayer interconnection structure according to claim 1, the forming the second conductive layer comprising forming a wiring pattern using a droplet discharge device.

8. A method of manufacturing a circuit board comprising:
   forming a first conductive layer over a substrate;
   forming a mask on the first conductive layer;
   forming an insulating layer on the first conductive layer outside of the mask;
   forming a contact hole in the insulating layer by removing the mask;
   filling the contact hole with a conductive material using a droplet discharge device to form a conductive contact member; and
   forming a second conductive layer electrically connected to the first conductive layer via the conductive contact member.

9. A method of manufacturing a device comprising:
   forming a first conductive layer over a substrate;
   forming a mask on the first conductive layer;
   forming an insulating layer on the first conductive layer outside of the mask;
   forming a contact hole in the insulating layer by removing the mask;
   filling the contact hole with a conductive material using a droplet discharge device to form a conductive contact member; and
   forming a second conductive layer electrically connected to the first conductive layer via the conductive contact member.

* * * * *